United States Patent [19]

Hong

[11] Patent Number: 5,492,587
[45] Date of Patent: Feb. 20, 1996

[54] METHOD FOR USING GLASS SUBSTRATE SURFACE MODIFIERS IN THE FABRICATION OF PHOTOCHEMICALLY STABLE DEEP ULTRAVIOLET PELLICLES

[76] Inventor: Gilbert H. Hong, 12820 Alta Tierra, Los Altos Hills, Calif. 94022

[21] Appl. No.: 223,983

[22] Filed: Apr. 6, 1994

Related U.S. Application Data

[60] Division of Ser. No. 936,758, Aug. 21, 1992, Pat. No. 5,344,677, and a continuation-in-part of Ser. No. 936,758, Aug. 21, 1992, Pat. No. 5,344,677.

[51] Int. Cl.[6] .................................................... B29D 7/01
[52] U.S. Cl. .................. 156/246; 156/74; 156/241; 156/242; 430/5; 428/38; 264/127; 264/216
[58] Field of Search ................. 156/60, 74, 241, 156/246, 242; 430/5; 428/38, 630, 13, 14; 264/128, 216

[56] References Cited

U.S. PATENT DOCUMENTS

| | | | |
|---|---|---|---|
| 3,607,491 | 9/1971 | Brown | 156/77 |
| 4,131,363 | 12/1978 | Shea et al. | 356/78 |
| 4,378,953 | 4/1983 | Winn | 350/171 |
| 4,523,974 | 6/1985 | Ducy | 156/247 X |
| 4,536,240 | 8/1985 | Winn | 156/74 |
| 4,657,805 | 4/1987 | Fukumitsu | 428/215 X |
| 4,737,387 | 4/1988 | Yen | 156/60 X |
| 4,833,051 | 5/1989 | Imamura | 430/5 X |
| 4,883,716 | 11/1989 | Effenberger | 264/216 X |
| 4,948,851 | 8/1990 | Squire | 526/247 |
| 4,973,142 | 11/1990 | Squire | 350/409 |
| 5,008,156 | 4/1991 | Hong | 428/506 |
| 5,059,451 | 10/1991 | Agou | 427/164 X |
| 5,061,024 | 10/1991 | Keys | 359/350 X |
| 5,085,899 | 2/1992 | Nakagawa | 428/14 X |
| 5,168,001 | 12/1992 | Legare | 428/194 X |
| 5,229,229 | 7/1993 | Sato | 430/5 X |
| 5,308,567 | 5/1994 | Kashida | 264/127 |

OTHER PUBLICATIONS

"Surface Coating," *Tappi*, Dec. 1980, p. 175.

Primary Examiner—David A. Simmons
Assistant Examiner—Steven J. Helmer
Attorney, Agent, or Firm—Thomas E. Schatzel

[57] ABSTRACT

A pellicle for use on a photomask reticle in conjunction with deep ultraviolet light wavelengths. The membrane of the pellicle comprises a purified fluoropolymer that has been spin coated on a glass substrate treated with a surface modifier and then separated and mounted on an aluminum frame. The aluminum frame has vents that filter air of contaminants and which allow an equalization of air pressure on both sides of the pellicle membrane when a peel-off backliner is in place on the opposite side of the frame. A permanent bond is made between the membrane and frame and a sticky adhesive is used to keep the backliner on the frame until peel-off. The sticky adhesive is such that the backliner may be re-attached a plurality of times.

2 Claims, 2 Drawing Sheets

METHOD FOR USING GLASS SUBSTRATE SURFACE MODIFIERS IN THE FABRICATION OF PHOTOCHEMICALLY STABLE DEEP ULTRAVIOLET PELLICLES

COPENDING APPLICATIONS

This application is a division and a continuation-in-part of U.S. patent application Ser. No. 07/936,758, filed Aug. 21, 1992, and titled, PHOTOCHEMICALLY STABLE DEEP ULTRAVIOLET PELLICLES FOR EXCIMER LASERS, now U.S. Pat. No. 5,344,677.

BACKGROUND OF THE INVENTION

1. Field of the Invention

The present invention relates to pellicles for protecting photomasks from particulate contamination and more particularly to pellicles suitable for use with deep ultraviolet radiation as is present when using excimer lasers.

2. Description of the Prior Art

Pellicles are used as protective covers to keep particulate matter outside of a focal plane of an optical apparatus so that a desirable image is not disturbed. Pellicles generally comprise thin, transparent membranes or films of polymer stretched over an aluminum frame that is mounted to form a hermetically sealed, dust-free enclosure over a photomask reticle. Pellicles are widely used in semiconductor manufacturing of integrated circuit, both to protect photomasks from particulate contamination and to extend the mask life. Their major function is to eliminate soft defects and improve die yield. The use of pellicles by semiconductor manufacturers is reviewed in detail by Ron Iscoff in "Pellicles 1985: An Update," *Semiconductor International* (April 1985). Projection printing systems also use pellicles, as is described by Shea, et al., in U.S. Pat. No. 4,131,363, issued Dec. 26, 1978. A broad class of pellicles and a method for forming these pellicles is also described by Winn, in U.S. Pat. Nos. 4,378,953 and 4,536,240, issued on Apr. 5, 1983 and Aug. 20, 1985, respectively. The following U.S. Pat. Nos. also describe pellicles: 4,973,142, issued Nov. 27, 1990, to Edward N. Squire, and assigned to du Pont; 4,948,851, issued Aug. 14, 1990, to Edward N. Squire, and assigned to du Pont; 5,008,156, issued Apr. 1, 1991, to Gilbert H. Hong, and assigned to Exion; and 4,657,805, issued Apr. 14, 1987, to Y. Fukumitsu, and assigned to Asahi Chemical.

Nitrocellulose has been widely used in pellicle manufacturing. But nitrocellulose is not suitable for 248 nanometers (or shorter wavelengths) lithography because nitrocellulose is highly absorbing at 248 nanometers and will rapidly degrade. The use of nitrocellulose has also declined because nitrocellulose is highly flammable and must be stored in a wetted condition. Nitrocellulose is also hygroscopic, which makes manufacturing under humid conditions difficult. Thus as a finished product, pellicles of nitrocellulose wrinkle when wetted with water, which makes cleaning or storing under humid conditions a problem. A critical problem with nitrocellulose pellicles is that the nitrocellulose material itself does not transmit ultraviolet (UV) light well enough for use in modern equipment that depend on the use of deep ultraviolet light. Irradiation with ultraviolet light can also cause a nitrocellulose pellicle membrane to become discolored, thus reducing its transparency. Below two hundred and sixty nanometers, even non-discolored nitrocellulose transmits less than seventy percent (70%) of incident light. This limitation in nitrocellulose, and also in MYLAR, when used in pellicles, is discussed by R. Hershel, in "Pellicle Protection of IC Masks," A Report by Hershel Consulting, Inc. (August 1981).

Advances in lithographic processes used in manufacturing integrated circuits depend on reducing the wavelength of the incident ultraviolet light used in conjunction with pellicles. The development of a broadband pellicle capable of transmitting ultraviolet light is described by I. E. Ward and D. L. Duly, in "Optical Microlithography III: Technology for the Next Decade," SPIE, Vol. 470, pp. 147–154 (H. L. Stover, Editor), 1984. Ward and Duly describe an antireflective layer that is coated on at least one side of a pellicle, in order to reduce any optical interference. Such optical interference is typically caused by internal reflections of light within a pellicle and is evidenced by an oscillating behavior in the transmission spectrum of a pellicle. Proposed solutions to this particular problem have included applying antireflective coatings and controlling the thickness of the membrane. Antireflective coatings do not adhere well to a pellicle's surface. The imperfect adhesion often then results in cracking and flaking of the antireflective coating, thus ruining the pellicle.

U.S. Pat. No. 4,657,805, issued Apr. 14, 1987, to Fukumitsu, et al., discloses the use of thin fluoropolymer films to serve as antireflective layers for a pellicle. Multiple layers of the fluoropolymer films are coated on a core layer pellicle to form a five-layer pellicle structure with the indexes of refraction of the various layers being chosen to reduce internal reflection and scattering.

The ultraviolet transmitting pellicles of Ward are described more completely in a series of three patents. U.S. Pat. No. 4,482,591, issued Nov. 13, 1984, discloses a pellicle comprised of polyvinyl butyral resin (PBR) and the use of a ring with an adhesive side to remove the pellicle from a wafer. U.S. Pat. No. 4,499,231, issued Feb. 15, 1985, discloses a pellicle comprising PBR and a dispersion of colloidal silica. U.S. Pat. No. 4,476,172, issued Oct. 9, 1984, discloses pellicles comprised of a PBR derivative that includes a silane moiety.

Problems also exist in the processes used to manufacture pellicles. For example, typically, a pellicle is formed by depositing a polymer solution on an inert substrate and then evaporating the solvent. This leaves the pellicle coated on the inert substrate. Removing the delicate pellicle from the substrate is a difficult, but a necessary step in the process. U.S. Pat. No. 4,536,240, issued to Winn, discloses a method for accomplishing this task by bonding a frame to the pellicle and then peeling the pellicle off the substrate. In conjunction with this procedure, a suitable release agent can be applied to the substrate prior to applying the fluoropolymer solution and thus aid in removing the pellicle. This procedure, however, results in a high number of pellicles being ripped during the removal step.

Duly, et al., in U.S. Pat. No. 4,523,974, issued Jun. 18, 1985, disclose a method for manufacturing a pellicle from polymethylmethacrylate (PMMA) that includes the steps of applying a gold film to the surface of an oxidized wafer, coating a thin layer of PMMA on the gold film, removing the PMMA and gold layers from the wafer and etching off the gold layer.

Microlithography trends for the last decade have been towards shorter and shorter wavelengths of ultraviolet radiation. The stepper radiation is changed from mercury G-line of 436 nanometers to I-line of 365 nanometers. A state-of-the-art stepper utilizes krypton fluoride emission at 248 nanometers and XE-F at 194 nanometers to delineate feature sizes around 0.3 micron.

Pellicles are well accepted by the photomask industry as an effective means of protecting the cleanliness of masks used in microlithographic processes. When masks are pelliclelized and used in transferring images of IC design on mask to wafer, the pellicles serve not only as a protective dust cover, but also as a part of the optics that do the lithographic imaging. Pellicle membranes must be photochemically stable to deep ultraviolet radiation, e.g., to wavelengths of 194 nanometers and 248 nanometers for excimer laser steppers. Pellicle membranes must be highly transparent into the deep ultraviolet range to guarantee high wafer throughput. Pellicle membranes must be very clean to ensure that no defects result in the wafers being processed. Pellicle membranes must be able to attach to an aluminum frame with appropriate adhesives and be strong, even at the typical thickness of 0.5 micrometers to 5.0 micrometers, to ensure the assembled pellicles are stout enough for ordinary use.

Although fluoropolymers have been described in the prior art as useful for deep ultraviolet pellicles with aluminum frames, a need nevertheless exists for a high yield method of casting the fluoropolymer films, a pellicle for eliminating bursting due to trapped air when the atmospheric pressure changes and a backliner that cooperates with robotics used in automated manufacturing facilities.

It is understood by those skilled in the art that pellicle manufacturing involves the coating of a glass substrate and a later peeling-off of a resulting membrane. Manufacturing yields are reduced by the tendency of the membrane to adhere too strongly to the glass substrate. In particular, this is a problem in the manufacture of deep ultraviolet (DUV) pellicles made of fluoropolymers.

SUMMARY OF THE PRESENT INVENTION

It is therefore an object of the present invention to provide a method of casting the fluoropolymer films.

It is a further object of the present invention to provide a pellicle frame that vents differences in atmospheric pressure to eliminate bursting in the pellicle membrane.

It is another object of the present invention to provide a pellicle with a backliner that is compatible with robotics used in automated manufacturing facilities.

Briefly, an embodiment of the present invention is a pellicle with a fluoropolymer membrane that has been spin coated on a nitrocellulose substrate before separating, a vented aluminum frame to which the separated fluoropolymer has been permanently bonded, and a stiff peel-off backliner that is secured to the aluminum frame with a sticky adhesive that permits multiple cycles of detachment and reattachment of the frame to backliner.

An advantage of the present invention is that it provides a pellicle that is economical to manufacture because very few of the fluoropolymer membranes are damaged during separation from their substrates.

Another advantage of the present invention is that it provides a pellicle that will not burst in or out due to changes in atmospheric pressure.

A further advantage of the present invention is that it provides a pellicle that is compatible with robotics used in automated manufacturing facilities.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
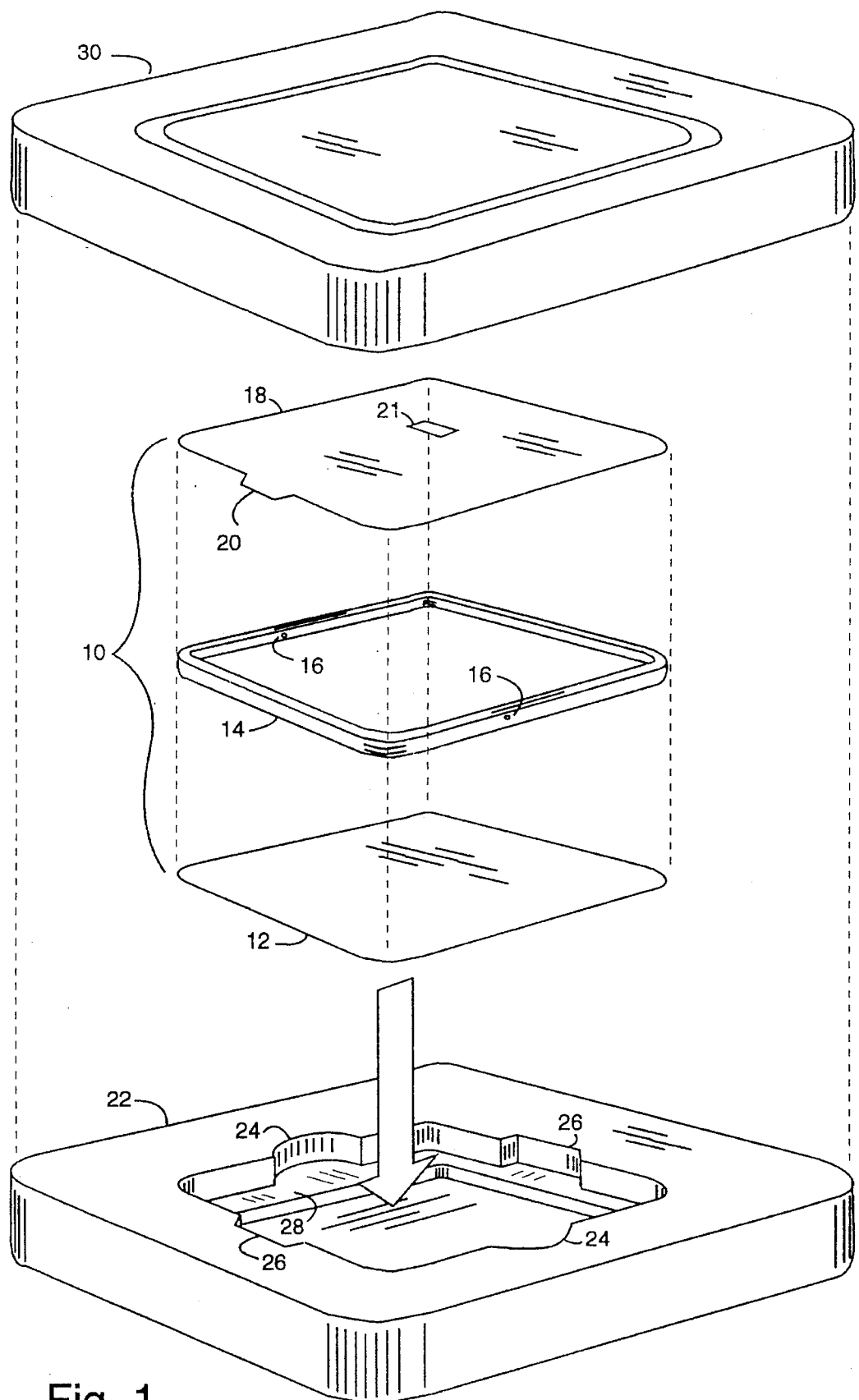
FIG. 1 is a perspective exploded assembly diagram of a pellicle and shipping container of the present invention.

FIG. 1 illustrates an embodiment of a pellicle of the present invention, referred to by the general reference numeral 10. The pellicle 10 comprises an amorphous fluoropolymer membrane 12, an aluminum frame 14 including vents 16 and a backliner 18 with a thumb tab 20 and an adhesive sticker 21. Acceptable fluoropolymer materials useful for membrane 12 include tetrafluoroethylene (TFE)-hexafluoropropylene (HFP) copolymer, vinylidene fluoride homopolymer, vinylidene fluoride (VdF)-TFE copolymer, TFE-perfluoroalkyl vinyl ether copolymer and VdF-ethylene copolymer. Preferred fluoropolymers are dissolvable in solvents and formable into uniform films by the spinner coating method. Pellicle 10 is intended for use in applications with 193 nanometers eximer laser radiation. The materials mentioned herein for membrane 12 are suitable for such use. Numerous application environments comprise ultraviolet radiation at 248 nanometers, and the materials mentioned herein for membrane 12 are also suitable for such use. Since such radiation may degrade membrane 12, the preferred thicknesses for membrane 12 ranges from a low of 0.5 microns to a high of three microns.

Du Pont has developed at least two fluoropolymer materials pertinent to pellicle manufacture and has made them commercially available. For example, see U.S. Pat. No. 4,973,142, issued Nov. 27, 1990, and U.S. Pat. No. 4,948,851, issued Aug. 14, 1990, both to Edward N. Squire. A first amorphous fluoropolymer is marketed by Du Pont as "AF-2400", which is a copolymer of perfluoro-2,2-dimethyl-1, 3-dioxide (PDD) and tetrafluoroethylene (TFE), with 85% PDD and 15% TFE. The glass transition temperature of this copolymer is 240° C. A second amorphous fluoropolymer is sold as "AF-1600", which is a copolymer of PDD and TFE with 65% PDD and 35% TFE. The glass transition temperature of this latter copolymer is 160° C. Generally, the higher the concentration of PDD, the higher will be the rigidity and the glass transition temperature. Both of these copolymers are soluble in 3M Company FC FLUORINERT liquids (e.g., FC 72 which has a boiling point of 56° C., and FC 40 which has a boiling point of 155° C.). AF-1600 can be prepared in a mixture of FC-72: FC/40 (1:3) to a concentration of 8–10% and AF-2400 to 2–3%. AF-1600 has exhibited adequate solubility to form acceptable pellicle membranes. Ashahi Glass (japan) markets a per-fluoro-cyclo-oxy-aliphatic-homopolymer under the name "CYTOP", which has a glass transition temperature of 108° C. and is more soluble in per-fluorited liquids. However the films it forms are not as rigid as the ones made of AF-1600 and AF-2400. Nevertheless, AF-1600 and CYTOP are suitable for application environments comprising ultraviolet radiation in the range of 190–500 nanometers.

For more information regarding such fluoropolymers, refer to U.S. Pat. No. 4,657,805, issued Apr. 14, 1987, to Fukimitsu, et al. For more information regarding spin-coating, refer to U.S. Pat. No. 4,536,240, issued Aug. 20, 1985, to R. Winn.

Frame 14 is typically 3.75 inches by 4.75 inches. The perimeter material of frame 14 is approximately 0.25 inches by 0.0625 inches. Vents 16 allow air but not contamination to pass through frame 14 such that changes in atmospheric pressure will not tend to burst membrane 12 in or out when both membrane 12 and backliner 18 are sealed to frame 14 or when pellicle 10 is in use on a photomask reticle. A high-strength, ultraviolet-curable cement is preferably used to permanently seal membrane 12 to frame 14. A tacky, restickable type adhesive is used to form a temporary seal between frame 14 and backliner 18 to allow multiple cycles of peel-off and reattachment of backliner 18 to frame 14. (Such an adhesive is familiar to lay persons as that used in the yellow 3M Company POST-IT note pads.) Sticker 21 is color-coded differently on each side, e.g., one side gold and the other side silver in color. Such color-coding assists a user in consistently returning the same side of backliner 18 to frame 14.

Pellicle 10 is preferably transported inside a shipping container bottom 22 which includes a pair of finger notches 24 and a pair of thumb tab notches 26. Pellicle 10 rests on a ledge 28 when deposited within shipping container bottom 22. A clear, see-through plastic shipping container cover 30 fits over shipping container bottom 22 such that pellicle 10 may be seen by a user and protected within during transport. The shipping container bottom 22 and cover 30 are such that they are compatible with robotic manipulators that can open cover 30, extract pellicle 10 and separate backliner 18 from frame 14. Backliner 18 is also stiff enough to allow a robotic vacuum lifter to lift away backliner 18 from the adhesive on frame 14. Such stiffness permits an automated system to remove backliner 18 without folding, wrinkling or stretching backliner 18. Pellicle 10 is then attached by robotic manipulation to a photomask reticle. Backliner 18 guards the air volume within frame 14 and behind membrane 12 from contamination until final mounting on the photomask, which is preferably done in a cleanroom environment. This function is especially important because it is the area between the photomask and membrane 12 that will be in the focal plane of the optics associated with the photomask. Any dirt or contamination within the focal plane will create optic anomalies that cause wafer processing defects. Any dirt or contamination outside pellicle 10, and therefore outside the focal plane, cannot be focused sharp enough to cause such defects.

Figure 2A:
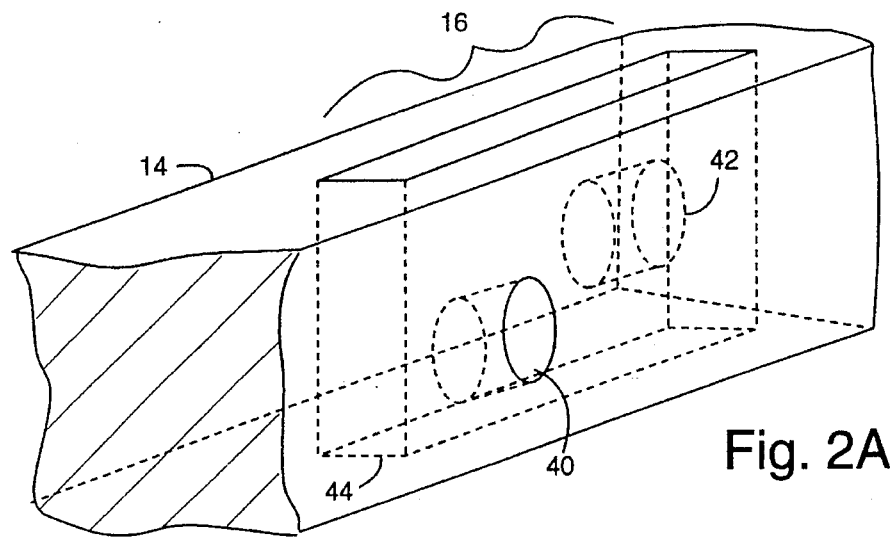
FIG. 2A is a perspective cutaway diagram of the vent in a part of the frame of the pellicle of FIG. 1.
Figure 2B:
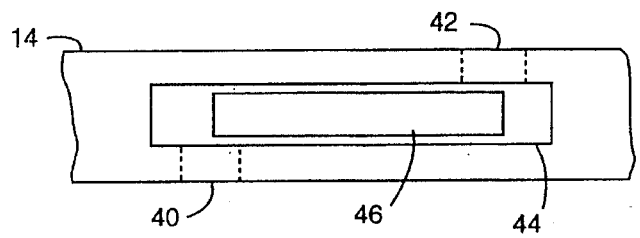
FIG. 2B is atop elevation view of the vent of FIG. 2A.
Figure 2C:
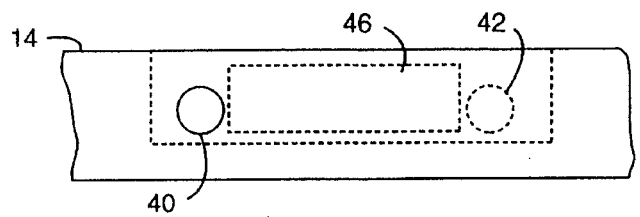
FIG. 2C is a side elevation view of the vent of FIG. 2A.

FIGS. 2A, 2B and 2C illustrate the construction of vent 16 which comprises a pair of holes 40 and 42 and a channel 44 within sidewall 14. Preferably, hole 40 and hole 42 are placed near opposite ends of the channel 44 such that air flow through vent 16 must pass through the length of channel 44. Holes 40 and 42 are therefore not straight through the wall 14, but rather are offset with each hole leading into the channel 44, one from inside the pellicle cavity and the other from the outside environment. Holes 40 and 42 are typically of 0.2–0.6 millimeters inside diameter and channel 44 has an inside width of 0.7 millimeters. The length and depth of channel 44 may be tailored to fit a filter material 46 (FIGS. 2B and 2C only) that may alternatively be disposed within channel 44. The inside geometry of channel 44 may be modified to gain certain benefits. For example, increasing the length of channel 44 may enhance the particle trapping capability, particularly if the adhesive used between frame 14 and backliner 18 forms one boundary of channel 44. Particles may also be blocked by shaping channel 44 in a zig-zag fashion. The air velocity of particles within channel 44 may also be decreased by shaping channel 44 like a horn. Tests by the inventor indicate that pellicle 10 when placed in the cargo bay of a high altitude commercial airliner will be able to bleed-off pressure differentials through vent 16 fast enough to cope with the normal rate of climb and descent of such aircraft before membrane 12 will be injured. The material selected for filter 46 must support high flowrates at the necessary pore sizes. Good tensile strength and resistance to fracture under lateral stresses is also important. Filter 46 may comprise a 3.0 micrometer filter of polytetrafluoroethylene, a hydrophobic material immune to wetting by the absorption of moisture. Fluoropore Company makes such filter material and sells it commercially. Filter 46 is attached to frame 14 with an adhesive, e.g., 3M Company adhesive 4952, such that the walls are at least one millimeter thick. The adhesive should be allowed to cure for at least thirty minutes after use before pellicle 10 is washed.

Pellicle membranes 12 are fabricated on a reusable nitrocellulose substrate according to the steps listed in Table I.

TABLE I

| STEP | DESCRIPTION |
|------|-------------|
| 1 | Depositing a film of nitrocellulose on a super-polished photomask-grade soda lime glass substrate. Both the nitrocellulose and glass substrate must be substantially free of any defects or contamination. The nitrocellulose deposited in a film that is approximately 0.5 to 3.0 micrometers thick, and should present a clean, non-stick surface. |
| 2 | Depositing a film of fluoropolymer, such as CYTOP or amorphous fluoropolymers 1600 or 2400, to a thickness of approximately 0.5 to 3.0 micrometers over the nitrocellulose film. A well-tuned spinner may be used to obtain a such a film thickness. |
| 3 | Bonding perimeter edges of the fluoropolymer film to pieces of mending tape with a fluoro-material, e.g., KEL-F-800. |
| 4 | Attaching with the mending tape a stainless steel frame on top of the stack of glass, nitrocellulose, fluoropolymer, and fluoro-adhesive films. |
| 5 | Peeling off the combination of film, mending tape and stainless steel frame. |
| 6 | Attaching only the fluoropolymer film of the combination of film, mending tape and stainless steel frame to an aluminum frame. |
| 7 | Trimming away the stainless steel frame and mending tape from outside the perimeter of the aluminum frame such that a taut fluoropolymer film is stretched over the aluminum frame. |

Figure 3:
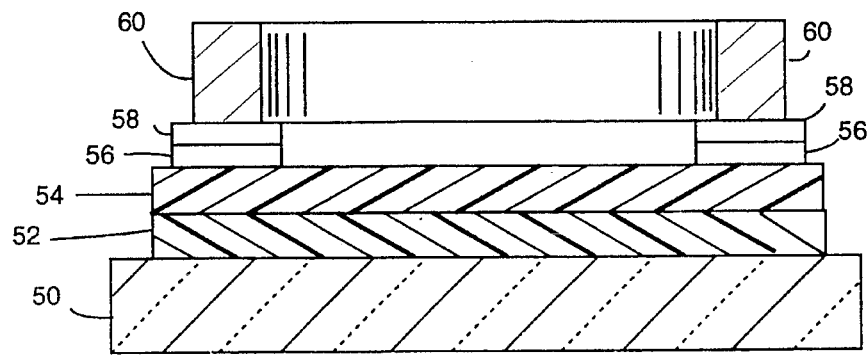
FIG. 3 is a cross-sectional diagram of the fluoropolymer membrane of the pellicle of FIG. 1 before being separated from the nitrocellulose on glass substrates on which it is formed by spin coating.

The first four steps of the process described in Table I results in the structure illustrated in FIG. 3 which comprises a soda lime glass substrate 50, a nitrocellulose intermediate layer 52, a fluoropolymer layer 54, a fluoro-adhesive layer 56, a mending tape layer 58 and a stainless steel frame 60. After a lifting-off with mending tape layer 58, layers 54, 56, 58 and frame 60 stay together and separate from layer 52, which remains on the glass substrate 50 and is typically left in a condition good enough to be reused. The prior art methods differ from the present invention in at least two ways. First, in the present invention, glass substrate 50 is coated with the nitrocellulose layer 52 before the additional layer of fluoropolymer 54 is applied. This takes advantage of the fact that the fluoropolymer layer 54 separates rather easily at the nitrocellulose-to-fluoropolymer interface. If fluoropolymer layer 54 were put directly on to glass 50, the glass-to-fluoropolymer interface would be very difficult to separate, and the film would probably tear in the attempt. The prior art solved such problems with the use of various solvents. Second, fluoro-adhesive 56 is applied to the fluoropolymer 54 such that the film can be lifted using a combination of mending tape 58 and stainless steel frame 60. The mending tape may be SCOTCH™ brand Magic Tape™ 810, as sold by 3M Commercial Office Supply Division (St. Paul, Minn. 55144-1000). Fluoropolymer 54 is then transferred to an aluminum frame, such as frame 14 (FIG. 1) and becomes what is identified as membrane 12 in FIG. 1 after trimming away stainless steel frame 60.

The method of fabricating pellicle membrane 12, described herein, is related to that described in U.S. Pat. No. 5,008,156, issued Apr. 16, 1991, to Gilbert H. Hong, the present inventor, and which patent disclosure is incorporated herein by reference. In general, some prior art methods start by preparing a coating solution of polymer in a solvent. This solution is filtered through a filter with a pore size of 0.2 micron, or smaller, in order to remove contaminants, and thus improve the clarity of the finished film. A class one hundred (or better) clean room is used during the pellicle manufacture to avoid airborne contamination. After filtering, the fluoropolymer solution is applied to a super-flat, smooth and defect-free substrate, using conventional spin-coating techniques. (Spin-coating is widely used in the semiconductor industry for obtaining polymer films and most of the accepted industry practices for obtaining defect-free coatings can be adapted to pellicle manufacturing.) Typically, a speed of about one thousand RPM is used to obtain a high quality two to three micron pellicle. Substrates of soda-lime glass are preferred. Prior to use, the glass substrate is cleaned by scrubbing in deionized water with detergent. The substrate is then rinsed with copious amounts of deionized water. This is followed by a second rinse with isopropyl alcohol using ultrasonic agitation. The substrate is dried in a degreaser tank with a chlorinated fluorocarbon, e.g., FREON. In consideration of the environment, other types of chemical degreasers may be preferred. After spin-coating, any residual solvent is removed from pellicle membrane by heating in a super-clean oven for about thirty minutes at approximately 60° to 90° C. This heating serves to increase membrane tensile strength by reducing stresses in the fluoropolymer. Additional layers may be added through additional spin-coating steps. In certain applications, and after drying, pellicle membrane is peeled-off of the glass substrate prior to being mounted to a square frame. This improves the yield of pellicle membranes by reducing membrane breakage. Typically, the square frame is made of stainless steel and has a thickness of about twenty mils and an inside dimension of six to seven inches, depending on the size of pellicle membrane. In general, the square frame is attached to pellicle membrane by adhesive strips, such as 3M SCOTCH brand Magic Tape. A membrane assembly, with the glass substrate on one side and the square frame on the other, is submerged into or sprayed with deionized water for about five minutes. An adhesion failure at the interface of the pellicle membrane and glass is induced by the parting action of the deionized water. The pellicle membrane separates from the glass substrate and yet remains attached to square frame. Either gentle heating or ambient evaporation heating will remove water droplets from the surface of the pellicle membrane. After the peel-off and drying, the pellicle membrane can be transferred to a frame. This is done by placing the square frame containing the pellicle membrane on top of the frame to which a permanent adhesive has previously been applied. After the permanent adhesive has hardened, the pellicle membrane is separated from the square frame by trimming away excess membrane material along the frame to yield the edge-mounted pellicle membrane. In typical applications, the thickness of pellicle membrane is chosen to be either 0.85 microns or 2.83 microns. In some variations, the thickness of pellicle membrane is varied to reduce optical interference effects or to adjust the strength of the membrane.

Fluoropolymers can generally be dissolved in a perfluorinated fluid, such as FLURINERT by 3M Company. However, the fluoro-adhesives preferably comprise material that is soluble in traditional solvents, e.g., methyl-ethyl ketone, ethoxy-ethyl acetate or propylene-methyl acetate. Good results have been obtained with KEL-F 800 (3M Company), and KYNAR 7201 and 9301 by Pennwalt have been proven to give acceptable results. The second layer must be dissolvable by a solvent that will not attack the first previously-spun layer.

Multiple-antireflective coated deep ultraviolet pellicle membranes 12 can be made by using a structure comprising a first fluoropolymer layer, a second fluoroadhesive layer with high-index, e.g., 1.435, and a third fluoropolymer layer. For example, the first layer comprises AF-1600, the second layer comprises KEL-F, and the third layer comprises AF-1600.

Two types of experiments were performed by the inventor. A relaxation experiment involved swelling of the membrane a distance dx, and then measuring the time ($dt_{return}$) required for dx to approach zero. A constant dx, or venting experiment involved pressurizing pellicle membrane 12 until it swelled to a given dx, measuring the differential pressure (dP), and then timing how long ($dt_{vent}$) the membrane 12 can be held at dx by controlling the rate of pressure drop through a vacuum valve. In this experiment the pellicle membrane 12 cavities are often nearly completely evacuated. The experiments were conducted in a non-cleanroom environment, in order to simulate a worst case scenario in terms of membrane efficiency and possible loading under severe conditions. The relaxation data provides a rough estimate of the average flowrate from a filtered pellicle membrane 12 whose vent hole is so restricted that venting times would be prohibitively long to measure. The venting data allows one to calculate the average flowrate through the vent hole at a given constant pressure as well as the rate of pressure drop needed to maintain this equilibrium. Four different pellicle membranes 12 have been used: an Exion Technology, Inc. (San Jose, Calif.) NI-108-63-B-G with a three millimeter diameter hole for vent 16, an Exion Technology PE-107-31-A-T with a groove and four 0.5 millimeters diameter holes for vent 16, an Exion Technology PB-107-31-A-T without a groove and with four holes of 1.0 millimeters, 0.7 millimeters, 0.7 millimeters, and 0.2 millimeters diameters for vents 16, an Exion Technology PE-107-31-A-T with two recessed holes with an inner diameter of 0.6 millimeters for vent 16, and an Exion Technology CA-122V-40-B-T.

Three types of adhesives have been used: 3M Company 447 (ten mil rubber-based), Norwood KC8031 (thirty mil), and 3M Company 4952 (45 mil, acrylic-based). The latter two adhesives were cut into rectangular shapes with holes for vents 16 of approximately 0.07"×0.018", with a minimum side wall thickness of 0.7 millimeters. This will increase the usable filter area, since the filter membrane may bottleneck the air flow.

Five different Millipore membrane filters have been used for filter 46 (FIGS. 2B and 2C): a 0.2 micrometer pore size Fluoropore (PTFE with a high density polyethylene backing), a 0.5 micrometer Fluoropore, a 1.0 micrometer Fluoropore, a 3.0 micrometer Fluoropore (PTFE with a polypropylene backing), and a 8.0 micrometer MF-Millipore (mixed esters of cellulose). All of the membranes were cut to the appropriate size from larger discs.

Pellicle 10 preferably can withstand stowage while being transported in the non-pressurized cargo hold of a commercial airplane climbing 10000 feet in three minutes. This creates an average rate of air pressure drop of 0.058 inches of mercury per second (" Hg/s). For pellicles 10, a dP of less than 1" Hg has been observed, which will cause less than 0.5 millimeters of deflection of membrane 12. The potential pressure drop rate could be as high as 0.067" Hg/s, however most cargo planes are at least partially pressurized and the probable rates are much less.

For vent holes 40 and 42 there may be no real optimal hole size, since micron pore size membrane filters restrict air flow by several percent of the uninhibited flow. The hole size of holes 40 and 42 should be as large as possible, leaving approximately at least one millimeter of space on frame 14 around holes 40 and 42 for adhesive. Alternatively, the size of holes 40 and 42 can be kept relatively small while the number of holes can be increased in compensation.

Of the many membrane filters that Millipore manufactures, only the MF-Millipore and the Fluoropore series were found to have met the necessary requirements for pore size and high flowrate. The MF-Millipore filters do not appear to be suitable for this application because they have insufficient tensile strength and fracture under very small lateral stresses. The Fluoropore filters, on the other hand, can stretch without tearing. In addition, they are made of polytetrafluoroethylene, a hydrophobic material, and are therefore immune to wetting by the absorption of moisture. Depending on the pore size, wetted membranes can require from one to twenty pounds per square inch (PSI) of pressure difference to clear. Of the three Fluoropore filters tested, the 3.0 micrometer filter performed the best, in terms of realizable flowrate. Actual production using this filter may, however, pose several problems, e.g., the polypropylene support side of the filter is fibrous and sheds when abraded, the stiff PTFE surface adheres only weakly to both the Norwood and 3M Company 4952 adhesives, and the filter 46 may peel off under stress. The adhesion is better with the other three Fluoropore filters because of their malleability. The PTFE side of the 3.0 micrometer filter also appears to be more fibrous than the others, resulting in a tendency to be sometimes pulled apart under stress. The 0.2 micrometer, 0.5 micrometer, and 1.0 micrometer Fluoropore filters are all supported by a web-like HDPE backing. In most cases, this backing will not affect the flowrate, but for small vent holes (0.1 millimeter radius) this material should and can be carefully peeled off of the PTFE membrane.

Adhesive configurations have consisted of a six millimeters by five millimeter piece of 3M Company 447 with a hole nearly the same size as vent holes 40 and 42. Other tests changed to Norwood and 3M Company 4952 with a larger, rectangular hole because the larger available filter surface area partially un-bottlenecked the flow and the greater thickness allowed the flow out of the orifice to more fully develop, resulting in better usage of the available surface area. There are a number of difficulties which must be resolved in manufacturing. A principal concern is the precision cutting of holes 40 and 42. For a pellicle 10 with a 3.1 millimeter standoff, for example, the adhesive is 3.1 millimeters wide while holes 40 and 42 are 1.7 millimeters ID. This permits walls of 0.7 millimeters on either side. With Norwood thirty mil (0.76 millimeters), the height of the walls is roughly equal to their width. For 3M Company 4952, the walls are 0.4 millimeters higher than they are thick. Both are spongy foam adhesives, and the result is an extremely difficult material to cut cleanly and precisely. After the adhesive is cut, then there may be additional problems with the application of filter 46 precisely to the adhesive and then the adhesive to frame 14. Other problems include possible outgassing of 4952, the durability of the filter-to-adhesive bond over time and the compatibility of a raised filter element with existing pellicle handling and mounting fixtures.

Nevertheless, it appears that the best solution at present in terms of flow is to include in vent 16 two to four large sized holes (0.4 millimeters to 0.5 millimeters) combined with the 3.0 micrometer Fluoropore filter for filter 46 attached to frame 14 with 3M Company 4952 adhesive cut such that the walls are at least one millimeter thick. Since the bond strength of 3M Company 4952 is supposed to build up in a logarithmic fashion over a 72 hour period, the completed assembly of pellicle 10 allowed to sit undisturbed for at least a half hour before washing. Possible modifications and configurations:

In an alternative embodiment, vent 16 is replaced by a recessed hole. A small circular filter is attached inside using either double-sticky tape or epoxy glue such that the filter material is flush with or below the surface of frame 14. This may resolve a potential problem of compatibility with existing pellicle fixtures, as well as relieving any concerns regarding the accidental removal of filter 46 in vent 16 since the recessed filter cannot be brushed out once it is attached inside the depression.

The present invention includes process schemes that use an adhesion promotor, a fluoropolymer, a surface modifier and a glass substrate. The surface modifier acts as a release agent to facilitate the separation of the fluoropolymer membrane that has filmed on the glass substrate. The adhesion promoter is used to enhance the adhesion of the film membrane to the frame.

Surface modifiers are, in general, regarded as release agents. However, in context with the present invention, such surface modifiers are defined as those having any affect on the surface. The inventor's research has demonstrated that it is sometimes necessary to promote adhesion so that additional layers of material may be deposited. Therefore, a surface modifier preferably optimizes the adhesion for additional deposited films, but not so strongly that yields are severely comprised by problems in peeling-off the whole film.

Surface modification research conducted by the present inventor with deposits of thin organic films with surface modifiers such as nitrocellulose has led to the following conclusions. The glass surfaces of the substrate should be modified by depositing a suitable surface material that expresses an affinity for glass that exceeds its affinity for fluoro-film. The resulting structure allows the fluoro-film to be separated from the surface modifier which stays with the glass substrate and can therefore e reused The adhesion of the fluoro-films with the surface modifier must be optimized to produce an affinity just great enough to support spin coating. Otherwise, a coating of fluoro-film would be prevented. However, that affinity cannot be so great as to compromise the later peeling-off of the film. The surface modifier must also be substantially pure. Filtering the surface modifier helps to form near perfect thin films with an optical smoothness that is as good as that of the surface of the glass substrate.

In particular, the research of the present inventor has led to the use of nitrocellulose, cellulose acetate, ethyl cellulose, cellulose acetate butyrate, polyvinyl butyral (PVB) and silicones, as surface modifiers. Acceptable silicones include those manufactured in the United States by General Electric (GE) as UV9300, UV9310C, the SL6000 series and the SL5000 series. Curing is done with heating or ultraviolet light, as directed by the manufacturer.

Therefore, with reference to FIG. 3, the nitrocellulose intermediate layer 52 can be substituted by materials which include nitrocellulose, cellulose acetate, ethyl cellulose, cellulose acetate butyrate, polyvinyl butyral (PVB) and silicones.

Fluoropolymer 1(AD) and 2(AS) appear to work the best with the ultraviolet-cured type of silicones. Fluoropolymer 2(AS) appears to works well with the PVB. In general, many pairs of film material and surface modifiers are possible.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method for forming a fluoropolymer film on a reusable nitrocellulose substrate and then separating the fluoropolymer film, the method comprising the steps of:

coating a nitrocellulose substrate on a super-polished photomask-grade soda lime glass substrate such that both said nitrocellulose substrate and said glass substrate are free of any defects or contamination, said nitrocellulose substrate being a film 0.5 to 3.0 micrometers thick and presenting a clean, non-sticking surface to fluoropolymers;

spin coating a fluoropolymer film on top of the nitrocellulose films to a thickness of approximately 0.5 to 3.0 micrometers;

bonding mending tape to said fluoropolymer film with a fluoroadhesive;

attaching a stainless steel frame placed on top of said glass-nitrocellulose-fluoropolymer-fluoroadhesive combination with said mending tape; and peeling off said fluoropolymer film from said nitrocellulose substrate such that said fluoropolymer film remains attached to said stainless steel frame.

2. A method for forming a fluoropolymer film on a reusable substrate and then separating the fluoropolymer film, the method comprising the steps of:

coating a substrate selected from the group of cellulose, acetate, ethyl cellulose, cellulose acetate butyrate, polyvinyl butyral and silicones on a superpolished photomask-grade soda lime glass substrate such that both said substrate and said glass substrate are free of any defects or contamination, said substrate being a film 0.5 to 3.0 micrometers thick and presenting a clean, non-sticking surface to fluoropolymers;

spin coating a fluoropolymer film on top of said substrate film to a thickness of approximately 0.5 to 3.0 micrometers;

bonding mending tape to said fluoropolymer film with a fluoroadhesive;

attaching a stainless steel frame placed on top of said glass substrate fluoropolymer-fluoroadhesive combination with said mending tape; and peeling off said fluoropolymer film from said substrate such that said fluoropolymer film remains attached to said stainless steel frame.

* * * * *